(12) United States Patent
Konarski

(10) Patent No.: US 6,670,430 B1
(45) Date of Patent: Dec. 30, 2003

(54) THERMOSETTING RESIN COMPOSITIONS COMPRISING EPOXY RESINS, ADHESION PROMOTERS, AND CURATIVES BASED ON THE COMBINATION OF NITROGEN COMPOUNDS AND TRANSITION METAL COMPLEXES

(75) Inventor: Mark M. Konarski, Old Saybrook, CT (US)

(73) Assignee: Henkel Loctite Corporation, Rocky Hill, CT (US)

(*) Notice: Subject to any disclaimer, the term of this patent is extended or adjusted under 35 U.S.C. 154(b) by 67 days.

(21) Appl. No.: 09/715,140

(22) Filed: Nov. 20, 2000

Related U.S. Application Data (60) Provisional application No. 60/172,133, filed on Dec. 17, 1999.

(51) Int. Cl.[7] .......................... C08L 63/00; C08L 63/02; C08L 63/04; C08F 59/50
(52) U.S. Cl. ...................... 525/523; 525/486; 528/122; 528/124
(58) Field of Search ................... 525/523, 486; 528/122, 124

(56) References Cited

U.S. PATENT DOCUMENTS

| | | | |
|---|---|---|---|
| 4,912,179 A | 3/1990 | Murakami et al. | 525/524 |
| 4,985,530 A | 1/1991 | Murakami et al. | 528/103 |
| 5,034,494 A | 7/1991 | Nakajima et al. | 528/94 |
| 5,091,474 A | 2/1992 | Murakami et al. | 525/109 |
| 5,350,826 A | 9/1994 | Watanabe et al. | 528/93 |
| 5,503,936 A | 4/1996 | Blyakhman | 428/413 |
| 5,512,372 A | 4/1996 | Blanc et al. | 428/413 |
| 5,541,000 A | 7/1996 | Hardy et al. | 428/413 |
| 5,554,714 A | 9/1996 | Muroi et al. | 528/94 |
| 5,561,204 A | 10/1996 | Muroi et al. | 525/524 |
| 5,672,431 A * | 9/1997 | Lin | 525/523 |
| 5,780,555 A | 7/1998 | Corley et al. | 525/407 |
| 5,940,688 A | 8/1999 | Higuchi et al. | 428/127 |
| 5,969,036 A | 10/1999 | Dersham | 524/779 |
| 6,214,904 B1 * | 4/2001 | Tanaka et al. | 525/109 |
| 6,277,930 B1 * | 8/2001 | Nishikawa | 525/526 |
| 6,278,192 B1 * | 8/2001 | Takigawa et al. | 257/787 |
| 6,342,577 B1 * | 1/2002 | Konarski et al. | 528/94 |
| 6,399,677 B2 * | 6/2002 | Tomiyoshi et al. | 523/466 |
| 6,403,715 B2 * | 6/2002 | Adachi et al. | 525/186 |

FOREIGN PATENT DOCUMENTS

| | | | |
|---|---|---|---|
| JP | 11-106480 A2 * | 4/1999 | |
| WO | WO 98/37134 | 8/1998 | |

OTHER PUBLICATIONS

Lee and Neville, Handbook of Epoxy Resins, McGraw–Hill Book Company, New York, New York, 1967, pp. 1–2 and 13–7 to 13–9.*

D.W. House, et al., The Versatility of Secondary Diamines in Polyurethane and Polyurea Systems (Sep., 1995).

C.P. Wong et al., "High Performance No–Flow Underfills for Low–Test Flip Chip Applications: Material Characterization", *IEEE Transactions on Components, Pack'g and Man'g Tech.—Part A*, 21, 3, 450–58 (Sep. 1998).

* cited by examiner

*Primary Examiner*—Robert E. L. Sellers
(74) *Attorney, Agent, or Firm*—Steven C. Bauman

(57) ABSTRACT

Thermosetting resin compositions useful as underfill sealants for mounting a semiconductor devices onto a circuit board are provided, which include epoxy resins, an adhesion promoter having at least two secondary amine groups, and a curative based on the combination of nitrogen-containing compounds and transition metal complexes.

15 Claims, 2 Drawing Sheets

FIG. 2

THERMOSETTING RESIN COMPOSITIONS COMPRISING EPOXY RESINS, ADHESION PROMOTERS, AND CURATIVES BASED ON THE COMBINATION OF NITROGEN COMPOUNDS AND TRANSITION METAL COMPLEXES

This application claims benefit of U.S. provisional application No. 60/172,133 filed Dec. 17, 1999.

BACKGROUND OF THE INVENTION

1. Field of the Invention

This invention relates to thermosetting resin compositions useful as underfill sealants for mounting to a circuit board semiconductor chips or semiconductor device packages, which have a semiconductor chip on a carrier substrate. Reaction products of these compositions demonstrate improved adhesion after exposure to elevated temperature conditions, improved resistance to moisture absorption and improved resistance to stress cracking.

2. Brief Description of Related Technology

In recent years, the popularity of smaller-sized electronic appliances has made desirable size reduction of semiconductor devices. As a result, chip packages are becoming reduced in size to substantially that of the bare die themselves. Such smaller-sized chip packages improve the characteristics of the microelectronic device in which it is used, while retaining many beneficial operating features. This serves to protect semiconductor bare chips, and increases their reliability and useful life.

Ordinarily, chip assemblies are connected to electrical conductors on a circuit board by use of solder connection or the like. However, when the resulting chip/circuit board structure is subjected to conditions of thermal cycling, reliability becomes suspect due to fatigue of the solder connection between the circuit board and the chip assembly. Recent manufacturing advances provide a sealing resin (often referred to as underfill sealant) in the space created by the mounting of a semiconductor device, such as a chip scale package ("CSP")/ball grid array ("BGA")/land grid array ("LGA") assembly or a flip chip ("FC") assembly, onto a circuit board to relieve stresses caused by thermal cycling. Underfill sealants have been seen to improve heat shock properties and enhance the reliability of such structures.

Of course, curable resin compositions generally are known. However, a perception to many end users of such resin compositions in microelectronics applications, such as underfill sealants, is their inability to retain adhesion after exposure to temperatures often reached during the solder reflow cycle. That is, due to the difference of the coefficients of thermal expansion of the components of the semiconductor device/circuit board interface, stresses in the underfill sealant occur (as contrasted to stresses in the semiconductor device and/or circuit board, had an appropriate underfill sealant not been used) during thermal cycling.

That is, thermosetting epoxy formulations when cured, are typically rigid and relatively brittle polymers with high modulus values. As such, much of the stress caused during thermal cycling is transferred to the CSP, BGA, LGA or FC assembly instead of the circuit board, resulting in cracking when the stresses become severe. While there are many commercially available flexibilizing agents, such as rubbers, thermoplastics, and diluents, that one may include to the formulation to improve flexibility by providing low modulus values, moisture absorption by the cured reaction product ordinarily increases as a result, often to an unacceptable degree.

Attempts at improving adhesion of such underfill sealants have often involved the inclusion of materials that would tend to decrease the crosslink density of the cured sealant. While such a decrease improves flexibility and thus oftentimes adhesion, it also has resulted in the increase of moisture absorption. Moisture absorption of such sealants is seen as a detriment to the overall function of the microelectronic device due to the increased chance of corrosion, and therefore the malfunctioning of the device.

UOP Corporation offers commercially under the tradename UNILINK a series of aromatic secondary diamines, which are promoted as useful in modifying the urea linkage in polyurethane and polyurea compositions. It is reported that the modification permits a greater amount of the diamine to be incorporated into the formulation, thereby resulting in a polyurethane or polyurea having superior strength and load bearing performance, as well as improved dimensional stability, as compared to foams prepared without the diamine. These diamines are not believed to have been promoted to date for use in epoxy-based formulations, such as ones not based on anhydride curing, let alone for the purpose of improving adhesion after exposure to elevated temperature conditions and resistance to moisture absorption.

U.S. Pat. No. 5,503,936 (Blyakhman) describes and claims curable modified epoxy resin compositions having an epoxy resin, a hardener or curing agent and 2.5 to 12.5% by weight of a compound represented by where E and T are $C_{5-12}$ alkyl, $C_{5-8}$ cycloalkyl, $C_{7-15}$ phenylalkyl, or $C_{6-10}$ aryl, with or without substitution by one or two $C_{1-4}$ groups. The hardeners or curing agents of the '936 patent are described as aliphatic, aromatic or cycloaliphatic di- or polyamines, such as diethylenetriamine, N-aminoethylpiperazine, 4,4'-diaminodicyclohexylmethane, 4,4'-diaminodiphenyl sulfone, diethyldiaminotoluene, dicyandiamide, or guanidine; polycarboxylic acid anhydrides, such as phthalic anhydride or trimellitic anhydride; catalytic curing agents such as tertiary amines, imidazoles or complexes of boron trifluoride; difunctional and multifunctional phenols; or phenol or cresol novolac resins.

In addition, in "High Performance No-Flow Underfills for Low-Test Flip Chip Applications: Material Characterization", *IEEE Transactions on Components, Pack'g and Man'g Tech.—Part A*, 21, 3, 450–58 (September 1998), C. P. Wong et al. describes the use of cobalt acetylacetonate as a curing catalyst for underfill materials based on certain epoxy resins and anhydrides. These curing catalysts are described as latent and are noted as having no noticeable concentration dependent effect on the final properties of the cured samples. See also International Patent Publication No. WO 98/37134. In the context of epoxy/cyanate ester curable compositions, see also U.S. Pat. No. 5,969,036 (Dershem).

It would be desirable for an underfill sealant composition to provide good adhesive properties, such as flexibility, while at least maintaining the current level of, if not improving the, resistance against moisture absorption, while improving the stress cracking resistance of the cured product. With such physical properties of the cured product, CSP, BGA, LGA and/or FC assemblies should have improved reliabilities, all else being equal of course.

SUMMARY OF THE INVENTION

The present invention is directed to thermosetting resin compositions, whose reaction products demonstrate improved adhesion, improved resistance to moisture absorption, and improved stress cracking resistance. The compositions include an epoxy resin component; a adhesion promoter component including at least two secondary amine functional groups; and a curative based on the combination of a nitrogen-containing compound and a transition metal complex.

In one microelectronic application, the inventive thermosetting resin compositions are useful as underfill sealant compositions, which (1) rapidly fill the underfill space in a semiconductor device, such as a FC assembly which includes a semiconductor chip mounted on a circuit board, the underfill space between a semiconductor chip and a carrier substrate of a CSP, and/or the underfill space between a CSP and a circuit board, (2) enables the semiconductor chip or device to be securely connected to a circuit board by short-time heat curing and with good productivity, (3) demonstrates excellent heat shock properties (or thermal cycle properties) and (4) demonstrates improved adhesion, resistance to moisture absorption, and resistance to stress cracking.

By using the thermosetting resin compositions of this invention, semiconductor devices, such as CSP, BGA or FC assemblies, may be securely connected to a circuit board by short-time heat curing of the composition, with the resulting mounted structure (at least in part due to the cured composition) demonstrating excellent heat shock properties (or thermal cycle properties). The cured adhesive retains its strength even after exposure to elevated temperature conditions, such as those temperatures reached during solder reflow cycles, and is not compromised by the stresses experienced as a result of the differences of coefficients of thermal expansion between and among the components of the semiconductor device and/or circuit board to which the semiconductor device is electrically attached. In addition, the cured adhesive demonstrates improved adhesion, resistance to moisture absorption, and resistance to stress cracking, particularly at elevated temperatures, and even when cycled between temperature extremes.

The present invention also provides a mounting structure for semiconductor devices. The mounting structure is constructed of a semiconductor device that includes a semiconductor chip mounted on a carrier substrate, and a circuit board to which the semiconductor device is electrically connected, with the space between the carrier substrate of the semiconductor device and the circuit board sealed with a reaction product of the inventive thermosetting resin composition.

In addition, the present invention provides a process for fabricating semiconductor devices. The process includes electrically connecting a semiconductor chip or semiconductor device, which includes a semiconductor chip mounted on a carrier substrate, to a circuit board, and infiltrating the inventive compositions into the space between the semiconductor chip or carrier substrate of the semiconductor device and the circuit board.

The compositions of this invention may also be used for microelectronic applications beyond sealing underfill, such as encapsulation, glob top, overfills and the like, as well as other applications for thermosetting compositions in which improved adhesion and improved resistance to water absorption are desirable.

The benefits and advantages of the present invention will become more readily apparent after a reading of the "Detailed Description of the Invention" together with the figure.

DETAILED DESCRIPTION OF THE INVENTION

As noted above, the thermosetting resin compositions which are useful as underfill sealants between a semiconductor chip, or a semiconductor device, which includes a semiconductor chip mounted on a carrier substrate, and a circuit board to which the semiconductor device is electrically connected, include an epoxy resin component, a is secondary amine-based adhesion promoting component and a curative based on the combination of a nitrogen containing compound and a transition metal complex. Reaction products of these compositions demonstrate improved adhesion, improved resistance to moisture absorption, and improved resistance to stress cracking.

Typically, the composition includes about 60 to about 95.8 weight percent of the epoxy resin component, about 5 to about 30 weight percent of the secondary amine-based adhesion promoting component, and about 0.2 to about 10 weight percent of the curative, of which about 80 to about 98 weight percent is comprised of the nitrogen containing compound and about 2 to about 20 weight percent is comprised of the transition metal complex.

The epoxy resin component of the present invention may include any common epoxy resin, which may have at least one multifunctional epoxy resin. The multifunctional epoxy resin is an art-recognized term used to define an epoxy resin having two or more epoxy groups per molecule.

Examples of such epoxy resins include polyglycidyl ethers of pyrocatechol, resorcinol, hydroquinone, 4,4'-dihydroxydiphenyl methane (or bisphenol F, such as RE-404-S or RE-410-S available commercially from Nippon Kayuku, Japan), 4,4'-dihydroxy-3,3'-dimethyldiphenyl methane, 4,4'-dihydroxydiphenyl dimethyl methane (or bisphenol A), 4,4'-dihydroxydiphenyl methyl methane, 4,4'-dihydroxydiphenyl cyclohexane, 4,4'-dihydroxy-3,3'-dimethyldiphenyl propane, 4,4'-dihydroxydiphenyl sulfone, and tris(4-hydroxyphyenyl)methane; polyglycidyl ethers of transition metal complex chlorination and bromination products of the above-mentioned diphenols; polyglycidyl ethers of novolacs; polyglycidyl ethers of diphenols obtained by esterifying ethers of diphenols obtained by esterifying salts of an aromatic hydrocarboxylic acid with a dihaloalkane or dihalogen dialkyl ether; polyglycidyl ethers of polyphenols obtained by condensing phenols and long-chain halogen paraffins containing at least two halogen atoms; N,N'-diglycidyl-aniline; N,N'-dimethyl-N,N'-diglycidyl-4,4'-diaminodiphenyl methane; N,N,N',N'-tetraglycidyl-4,4'-diaminodiphenyl methane; N,N'-diglycidyl-4-aminophenyl glycidyl ether;. N,N,N',N'-tetraglycidyl-1,3-propylene bis-4-aminobenzoate; phenol novolac epoxy resin; cresol novolac epoxy resin; and combinations thereof. $C_4$–$C_{28}$ alkyl glycidyl ethers, $C_2$–$C_{28}$ alkyl-and alkenyl-glycidyl ethers; and $C_1$–$C_{28}$ alkyl, monophenol and polyphenol glycidyl ethers can form part of the epoxy resin component when used in combination with the epoxy resin.

Among the commercially available epoxy resins suitable for use herein are polyglycidyl derivatives of phenolic compounds, such as those available under the tradenames EPON 828, EPON 1001, EPON 1009, and EPON 1031, from Shell Chemical Co.; DER 331, DER 332, DER 334, and DER 542 from Dow Chemical Co.; GY285 from Ciba Specialty Chemicals, Tarrytown, N.Y.; and BREN-S from Nippon Kayaku, Japan. Other suitable epoxy resins include polyepoxides prepared from polyols and the like and polyglycidyl derivatives of phenol-formaldehyde novolacs, the latter of which are available commercially under the tradenames DEN 431, DEN 438, and DEN 439 from Dow Chemical Company. Cresol analogs are also available commercially ECN 1235, ECN 1273, and ECN 1299-from Ciba Specialty Chemicals. SU-8 is a bisphenol A-type epoxy novolac available from Shell Chemicals (formerly, Interez, Inc.). Polyglycidyl adducts of amines, aminoalcohols and polycarboxylic acids are also useful in this invention, commercially available resins of which include GLYAMINE 135, GLYAMINE 125, and GLYAMINE 115 from F.I.C. Corporation; ARALDITE MY-720, ARALDITE MY-721, ARALDITE 0500, and ARALDITE 0510 from Ciba Specialty Chemicals and PGA-X and PGA-C from the Sherwin-Williams Co. And of course combinations of the different epoxy resins are also desirable for use herein.

As noted above, the epoxy resin component of the present invention may include any common epoxy resin, at least a portion of which is a multifunctional epoxy resin. ordinarily, the multifunctional epoxy resin should be included in amount within the range of about 20 weight percent to about 100 weight percent of the epoxy resin component.

A monofunctional epoxy resin, if present, should ordinarily be used as a reactive diluent, or crosslink density modifier. In the event such a monofunctional epoxy resin is included as a portion of the epoxy resin component, such resin should be employed in an amount of up to about 20 weight percent, based on the total epoxy resin component.

In choosing epoxy resins for the epoxy resin component of the compositions of the present invention, consideration should also be given to viscosity and other properties thereof.

The secondary amine-based adhesion promoting component should have at least two secondary amines available for reaction. For instance, the secondary amine-based adhesion promoting component may be represented as within the following structure I:

I where R and $R^1$ may be the same or different and may be selected from $C_{1-12}$ alkyl, $C_{1-12}$ alkenyl, $C_{5-12}$ cyclo or bicycloalkyl, $C_{6-18}$ aryl, and derivatives thereof, and $O$ may be selected from $C_{1-12}$ alkylene, $C_{1-12}$ alkenylene, $C_{5-12}$ cyclo or bicycloalkylene, $C_{5-12}$ cyclo or bicycloalkenylene, $C_{6-18}$ arylene, and derivatives thereof.

Within structure I are a variety of secondary amines that may be used herein, for instance, the aromatic secondary diamines represented by structures II–V below:

Structure II (UNILINK 4200) is N,N'-bis-(2-butyl)-p-methylene dianiline, structure III (UNILINK 7100) is N,N'-bis-4-(5-methyl-2-butyl)-p-phenylene diamine, structure IV (UNILINK 4100) is N,N'-bis-4-(2-butyl)-p-phenylene diamine, and structure V (UNILINK 4102) is N,N'-bis-4-(2-methylpropyl)-o-phenylene diamine.

In addition, within structure I is structure VI below, which is N-2-pentyl-N'-phenyl-p-phenylene diamine, which may also be used.

VI

This phenylene diamine is believed to be available from Uniroyal Chemical Co., under the tradename FLEXZONE 7L.

The secondary amine-based adhesion promoting component should be used in the inventive compositions in an amount within the range of about 5 to about 30 weight percent, with about 13 to about 20 weight percent being particularly desirable, depending of course on the identity of the chosen secondary amine-based adhesion promoting component.

The curative includes a combination of nitrogen-containing compounds, like amines, imidazoles, amides, and like, and combinations thereof, and a transition metal complex.

Examples of the amine compounds polyamines and di- and tri-aza compounds, such as

1,5-diazabicyclo [3.4.0] non-5-ene;

1,8-diazabicyclo[5.4.0]undec-7-ene;

1,5,7-triazabicyclo[4.4.0]dec-5-ene; the bicyclo mono- and di-aza compounds:

quinuclidine;

1,4-diazabicyclo[2.2.2]octane;
  the aliphatic polyamines:
    diethylenetriamine, triethylenetetraamine, diethylaminopropylamine;
  the aromatic polyamines:
    benzyl dimethylamine, m-xylenediamine, diaminodiphenylamine
    and quinoxaline; and
  the alicyclic polyamines:
    isophoronediamine and menthenediamine.

Of course, combinations of these amine compounds are also desirable for use in the compositions of the present invention.

Examples of imidazoles include imidazole and derivatives thereof, such as isoimidazole, imidazole, alkyl substituted imidazoles, such as 2-ethyl-4-methylimidazole, 2,4-dimethylimidazole, butylimidazole, 2-heptadecenyl-4-methylimidazole, 2-methylimidazole, 2-undecenylimidazole, 1-vinyl-2-methylimidazole, 2-undecylimidazole, 2-heptadecylimidazole, 2-phenylimidazole, 1-benzyl-2-methylimidazole, 1-propyl-2-methylimidazole, 1-cyanoethyl-2-methylimidazole, 1-cyanoethyl-2-ethyl-4-methylimidazole, 1-cyanoethyl-2-undecylimidazole, 1-cyanoethyl-2-phenylimidazole, 1-guanaminoethyl-2-methylimidazole and addition products of an imidazole methylimidazole and addition products of an imidazole and trimellitic acid, 2-n-heptadecyl-4-methylimidazole and the like, generally where each alkyl substituent contains up to about 17 carbon atoms and desirably up to about 6 carbon atoms, aryl substituted imidazoles, such as phenylimidazole, benzylimidazole, 2-methyl-4,5-diphenylimidazole, 2,3,5-triphenylimidazole, 2-styrylimidazole, 1-(dodecyl benzyl)-2-methylimidazole, 2-(2-hydroxyl-4-t-butylphenyl)-4,5-diphenylimidazole, 2-(2-methoxyphenyl)-4,5-diphenylimidazole, 2-(3-hydroxyphenyl)-4,5-diphenylimidazole, 2-(p-dimethylaminophenyl)-4,5-diphenylimidazole, 2-(2-hydroxyphenyl)-4,5-diphenylimidazole, di(4,5-diphenyl-2-imidazole)-benzene-1,4, 2-naphthyl-4,5-diphenylimidazole, 1-benzyl-2-methylimidazole, 2-p-methoxystyrylimidazole, and the like generally where each aryl substituent contains up to about 10 carbon atoms and desirably up to about 8 carbon atoms.

A particularly desirable imidazole for use herein is 1-(2-cyanoethyl)-2-ethyl-4-methylimidazole, available commercially from Borregaard Synthesis Inc., Newburyport, Mass. under the tradename CURIMID CN Of course, combinations of these imidazoles are also desirable as the imidazole component of the latent hardener component of the compositions of the present invention.

Examples of amide compounds include cyano-functionalized amides, such as dicyandiamide.

Of course, combinations of these various nitrogen containing compounds are also desirable for use in the compositions of the present invention.

The transition metal complex may be chosen from a variety of organometallic materials or metallocenes. Those materials of particular interest herein may be represented by metallocenes within structure VII:

VII where $R_1$ and $R_2$ may be the same or different and may occur at least once and up to as many four times on each ring in the event of a five-membered ring and up to as many as five times on each ring in the event of a six-membered ring;

$R_1$ and $R_2$ may be selected from H; any straight- or branched-chain alkyl constituent having from 1 to about 8 carbon atoms, such as —$CH_3$, —$CH_2CH_3$, —$CH_2CH_2CH_3$, —$CH(CH_3)_2$, —$C(CH_3)_3$ or the like; acetyl; vinyl; allyl; hydroxyl; carboxyl; —$(CH_2)_n$—OH, where n may be an integer in the range of 1 to about 8; —$(CH_2)_n$—$COOR_3$, where n may be an integer in the range of 1 to about 8 and $R_3$ may be any straight- or branched-chain alkyl constituent having from 1 to about 8 carbon atoms; H; Li; Na; —$(CH_2)_n$—$OR_4$, wherein n may be an integer in the range of 1 to about 8 and $R_4$ may be any straight- or branched-chain alkyl constituent having from 1 to about 8 carbon atoms; or —$(CH_2)_nN^+(CH_3)_3$ $X^-$, where n may be an integer in the range of 1 to about 8 and X may be $Cl^-$, $Br^-$, $I^-$, $ClO_4^-$ or $BF_4^-$;

$Y_1$ and $Y_2$ may not be present at all, but when at least one is present they may be the same or different and may be selected from H, $Cl^-$, $Br^-$, $I^-$, cyano, methoxy, acetyl, hydroxy, nitro, trialkylamines, triaryamines, trialkylphosphines, triphenylamine, tosyl and the like;

A and A' may be the same or different and may be C or N;

m and m' may be the same or different and may be 1 or 2; and $M_e$ is Fe, Ti, Ru, Co, Ni, Cr, Cu, Mn, Pd, Ag, Rh, Pt, Zr, Hf, Nb, V, Mo and the like.

Of course, depending on valence state, the element represented by $M_e$ may have additional ligands—$Y_1$ and $Y_2$—associated therewith beyond the carbocyclic ligands depicted above (such as where $M_e$ is Ti and $Y_1$ and $Y_2$ are Cl⁻). Alternatively, metallocene structure VII may be modified to include materials such as those within structure VIII below:

VIII where $R_1$, $R_2$, $Y_1$, A, A', m, m' and $M_e$ are as defined above.

A particularly desirable example of such a material is where $R_1$ and $R_2$ are each H; $Y_1$ and $Y_2$ are each Cl; A and A' are each N; m and m' are each 2 and $M_e$ is Ru.

Within metallocene structure VII, well-suited metallocene materials may be chosen from within metallocene structure IX:

IX where $R_1$, $R_2$ and $M_e$ are as defined above.

Particularly well-suited metallocene materials from within structure I may be chosen where $R_1$, $R_2$, $Y_1$, $Y_2$, m and m' are as defined above, and $M_e$ is chosen from Ti, Cr, Cu, Mn, Ag, Zr, Hf, Nb, V and Mo.

Desirably, the metallocene is selected from ferrocenes (i.e., where $M_e$ is Fe), such as ferrocene, vinyl ferrocenes, ferrocene derivatives, such as butyl ferrocenes or diarylphosphino metal-complexed ferrocenes [e.g., 1,1-bis (diphenylphosphino) ferrocene-palladium dichloride], titanocenes (i.e., where $M_e$ is Ti), such as bis($\eta^5$-2,4-cyclopentadien-1-yl)-bis-[2,6-difluoro-3-(1H-pyrrol-1-yl) phenyl] titanium which is available commercially from Ciba Specialty Chemicals, Tarrytown, N.Y. under the tradename "IRGACURE" 784DC, and derivatives and combinations thereof. A particularly desirable metallocene is ferrocene.

And bis-alkylmetallocenes, for instance, bis-alkylferrocenes (such as diferrocenyl ethane, propanes, butanes and the like) are also desirable for use herein, particularly since about half of the equivalent weight of the material (as compared to a non-bis-metallocene) may be employed to obtain the sought-after results, all else being unchanged. Of these materials, diferrocenyl ethane is particularly desirable.

Of course, other materials are well-suited for use $M_e[CW_3-CO-CH=C(O^-)-CW'_3]_2$, where $M_e$ is as defined above, and W and W' may be the same or different and may be selected from H, and halogens, such as F and Cl. Examples of such materials include platinum (II) acetylacetonate ("PtACAC"), cobalt (II) acetylacetonate ("Co(II) ACAC"), cobalt (III) acetylacetonate ("Co(III)ACAC"), nickel (II) acetylacetonate ("NiACAC"), iron (II) acetylacetonate ("Fe(II)ACAC"), iron (III) acetylacetonate ("Fe(III) ACAC"), chromium (II) acetylacetonate ("Cr(II)ACAC"), chromium (III) acetylacetonate ("Cr(III)ACAC"), manganese (II) acetylacetonate ("Mn(II)ACAC"), manganese (III) acetylacetonate ("Mn(III)ACAC") and copper (II) acetylacetonate ("CuACAC").

Of course, combinations of these transition metal complexes may also be employed.

The curative should be used in the inventive compositions in an amount within the range of about 0.5 to about 10 weight percent, such as about 1 to about 7 weight percent, with about 5 to about 7 weight percent being particularly desirable. The nitrogen containing compound should form between about 80 to about 98 weight percent of the curative, with the balance being the transition metal complex.

Optionally, the thermosetting resin compositions of the present invention may contain other components, such as defoaming agents, leveling agents, adhesion promoters, dyes, pigments and fillers. The fillers may be included to alter the physical properties of the compositions, such as for rheology control, lowering moisture absorption and/or structure building properties. Moreover, the compositions may also contain photopolymerization initiators, provided such materials do not adversely affect the desired properties of the composition.

The thermosetting resin compositions of the present invention may be of the one-pack type, in which all the ingredients are mixed together, or of the two-pack type in which the epoxy resin component and latent hardener component are stored separately and mixed together prior to use.

During application, the thermosetting resin compositions according to the present invention penetrate and flow readily into the space between the circuit board and the semiconductor device, or at least show a reduction in viscosity under heated or use conditions thus penetrating and flowing easily.

Generally, it is desirable to prepare the thermosetting resin compositions of this invention by selecting the types and proportions of various components so that the gel time will be tailored to a specified period of time (such as 1 minute or 2 minutes) at a temperature of about 150° C. In such case, the inventive compositions should show no or substantially no increase of viscosity after a period of time of about six hours at room temperature. With such a pot life, the compositions demonstrate the ability to penetrate into the space between the circuit board and the semiconductor device (e.g., of 100 to 200 μm) relatively rapidly, and allow for a greater number of assemblies to be underfilled without observing a viscosity increase in the compositions, thereby rendering them less effective for application.

The inventive compositions may also include a filler component. The filler component acts to reduce the differences in the coefficient of thermal expansion between the circuit board or carrier substrate and the silicon die, depending on the nature of the filler lower moisture pick up, and tends to increase viscosity. Appropriate filler components include silica (commercially available from Tatsumori), alumina (commercially available from Showa Denko), silica-coated aluminum nitride (commercially available from Dow Chemical), silver flake (commercially available from Degussa), zinc oxide (commercially available from Zinc Corporation of America), magnesium oxide (commercially available from Carborundum Corporation), boron nitride (commercially available from Carborundum Corporation), titanium oxide (commercially available from DuPont Corporation) and the like.

Generally, about 0.1 to about 300 weight percent of the filler component may be used, with about 150 to 180 weight percent being desirable.

Figure 1:
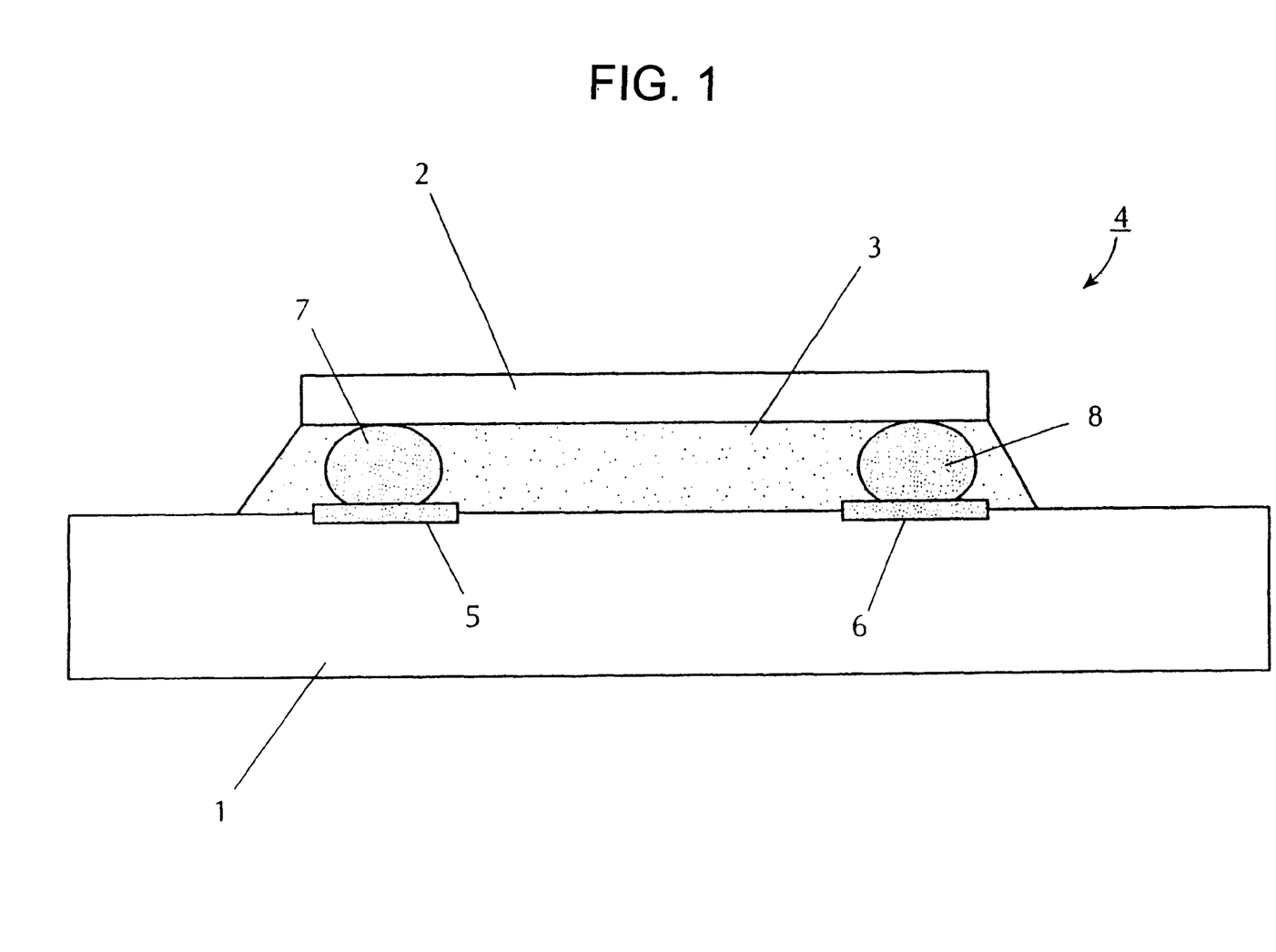
FIG. 1 depicts a cross-sectional view showing an example of a mounted structure with which the thermosetting resin composition of the present invention is used as an underfill sealant.

Reference to FIG. 1 shows a mounted structure (i.e., a flip chip package) in which a thermosetting resin composition of the present invention has been applied and cured.

The flip chip package 4 is formed by connecting a semiconductor chip (a bare chip) 2 to a circuit board 1, and sealing the space therebetween suitably with a thermosetting resin composition 3. The semiconductor chip 2 is mounted at a predetermined position on the circuit board 1 and electrodes 5 and 6 are electrically connected by a suitable electrical connection material 7 and 8, such as solder. In order to improve reliability, the space between the semiconductor chip 2 and the circuit board 1 is sealed with a thermosetting resin composition 3.

Figure 2:
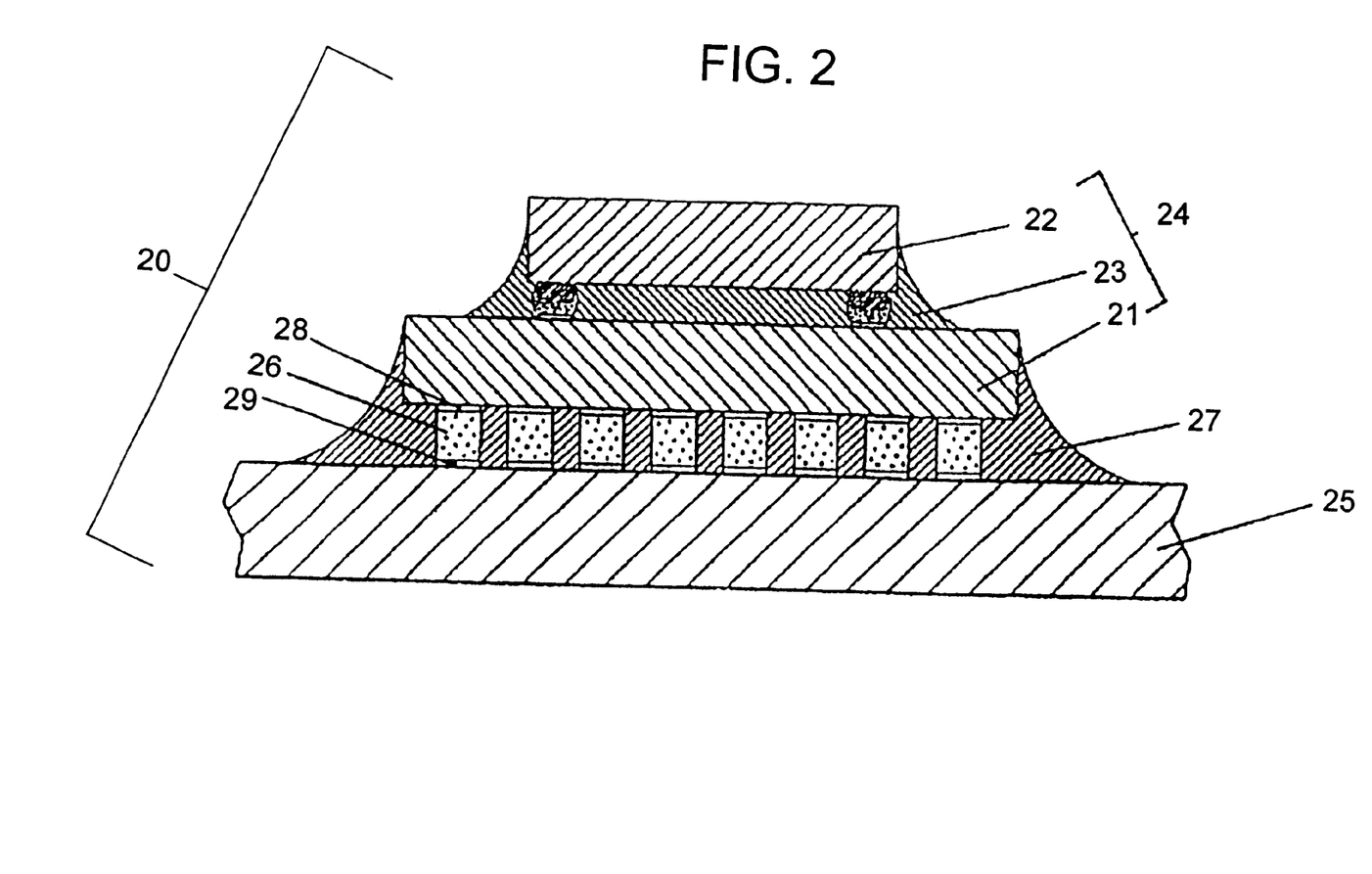
FIG. 2 depicts a cross-sectional view showing another example of a mounted structure with which the thermosetting resin composition of the present invention is used as an underfill sealant.

An alternative mounted structure, a CSP 20, is shown in FIG. 2. There, a semiconductor device 24 constructed of a semiconductor chip 22 connected to a carrier substrate 21, the space therebetween suitably sealed with a thermosetting resin composition 23. The mounted structure 20 is mounted at a predetermined position on the circuit board 21, and electrodes 28 and 29 are electrically connected by a suitable electrical connection material 26, such as solder. In order to improve reliability, the space between the mounted structure 20 and the circuit board 25 is sealed with a thermosetting resin composition 27, and then cured. The cured product of the thermosetting resin composition should completely fill that space.

Carrier substrates may be constructed from ceramic substrates of $Al_2O_3$, $SiN_3$ and mullite ($Al_2O_3$—$SiO_2$); substrates or tapes of heat-resistant resins, such as polyamides; polyimides; bismaleimide triazines; glass-reinforced epoxy; ABS and phenolic substrates which are also used commonly as circuit boards; and the like. Any electrical connection of the semiconductor chip to the carrier substrate may be used, such as connection by a high-melting solder or electrically (or anisotropically) conductive adhesive, wire bonding, and the like. In order to facilitate connections, the electrodes may be formed as bumps.

In a typical mounting process, solder ball (e.g., in cream or form) may be printed at appropriate positions on a carrier substrate and suitably dried to expel solvent. A semiconductor chip may then mounted in conformity with the pattern on the carrier substrate. This carrier substrate is then passed through a reflowing furnace to melt the solder to connect the semiconductor chip. Moreover, the solder may be applied or formed on either the carrier substrate or the semiconductor chip. Alternatively, this connection may also be made by an electrically conductive adhesive or an anisotropically conductive adhesive.

After the semiconductor chip is electrically connected to the carrier substrate, the resulting structure is ordinarily subjected to a continuity test or the like. After passing such test, the semiconductor chip may be fixed thereto with a thermosetting resin composition, as described below. In this way, in the event of a failure, the semiconductor chip may be removed before it is fixed to the carrier substrate with the thermosetting resin composition.

Using a suitable application means, such as a dispenser, a thermosetting resin composition in accordance with this invention is applied to the periphery of the electrically-connected semiconductor chip. The composition penetrates by capillary action into the space between the carrier substrate and the semiconductor chip.

The thermosetting resin composition is then thermally cured by the application of heat. During the early stage of heating, the thermosetting resin composition shows a significant reduction in viscosity and hence an increase in fluidity, so that it more easily penetrates into the space between the carrier substrate and the semiconductor chip. Moreover, by preheating the carrier substrate, the thermosetting resin composition is allowed to penetrate fully into the entire space between the carrier substrate and the semiconductor chip.

Cured reaction products of the thermosetting resin compositions of the present invention demonstrate excellent adhesive force, heat resistance and electric properties, and acceptable mechanical properties, such as flex-cracking resistance, chemical resistance, moisture resistance and the like, for the applications for which they are used herein.

The amount of thermosetting resin composition applied should be suitably adjusted so as to fill almost completely the space between the carrier substrate and the semiconductor chip, which amount of course may vary depending on application.

Thermosetting resin compositions of the present invention may ordinarily be cured by heating to a temperature in the range of about 120 to about 180° C. for a period of time of about 0.5 to 30 minutes. However, generally after application of the composition, an initial cure time of about 1 minute sets up the composition, and complete cure is observed after about 15 minutes at a temperature of about 150° C. Thus, the composition of the present invention can be used in relatively moderate temperatures and short-time curing conditions, and hence achieve very good productivity.

The present invention will be more readily appreciated with reference to the examples which follow.

EXAMPLES

Example 1

In this example, compositions were prepared and evaluated for performance in contrast with compositions prepared without the secondary amine-based adhesion promoting component and with known flexiblizers that promote adhesion, but do so while compromising resistance to water absorption.

More specifically, thermosetting resin compositions for underfill applications were prepared by mixing together with stirring for a period of time of about 10 minutes at room temperature in an open vessel an epoxy resin component including 100 weight percent of bisphenol F-type epoxy resin, 20 weight percent of a secondary amine-based adhesion promoting component [N,N'-bis-4-(2-methylpropyl)-p-phenylene diamine, available commercially from UOP Corporation, under the tradename UNILINK 4100], and 3 weight percent of a curative (1-(2-cyanoethyl)-2-ethyl-4-methylimidazole, available commercially from Borregaard Synthesis Inc., Newburyport, Mass. under the tradename CURIMID CN).

After formation, the composition was transferred to a 10 ml syringe made of non-reactive plastic, and the composition was dispensed through the 12G needle of the syringe into the junction between the carrier substrate and semiconductor chip in a previously formed assembly. As such, the composition acts as an encapsulant for the electrical solder connection.

After dispensing was complete, the assembly was transferred to an oven while the temperature was maintained at about 150° C. The composition cured initially after about 1 minute, and thereafter cured completely after about 15 minutes at that temperature.

Separately, the composition was placed between a pair of lap shears and cured in the same way as the assembly above. The bound lap shears were removed from the oven and allowed to reach room temperature, at which point they were evaluated for bond strength. The cured composition was found to possess lap shear strength of about 1660 psi.

With respect to shelf-life stability, as noted above the gel time of the composition was tailored to 1 minute at a temperature of 150° C. This composition was observed to experience no viscosity increase at room temperature after a period of time of 6 hours; after a period of time of about 15 hours the viscosity increase was observed to be about 52%; and after a period of time of about 24 hours the viscosity increase was observed to be about 88%.

Compositions A–D were prepared with the components listed in the noted amounts, in parts per hundred ("phr"). (See Table 1.) As can be seen, Component A is an epoxy-based composition used as a control with no adhesion promoting component at all, while Components C and D are epoxy-based compositions in which an acrylonitrile rubber and a polyether flexibilizer, respectively, have been included as the adhesion ting component.

TABLE 1

| Component | | Composition (phr) | | | |
|---|---|---|---|---|---|
| Type | Identity | A | B | C | D |
| Epoxy | Bisphenol F epoxy | 100 | 100 | 100 | 100 |
| Secondary Amine Adhesion Promoter | UNILINK 4100 | — | 20 | — | — |
| Flexibilizer | Acrylonitrile rubber (ATBN) | — | — | 20 | — |
| Flexibilizer | Polyether flexibilizer (D2000) | — | — | — | 20 |
| Curative | CURIMID CN | 3 | 3 | 3 | 3 |

The performance of these compositions is set forth below in Table 2.
Table 2.

TABLE 2

| | Composition | | | |
|---|---|---|---|---|
| Physical Properties | A | B | C | D |
| Flexibility: 20 mil film bends around 0.25" radius without cracking | No | Yes | Yes | Yes |
| Immersion in boiling water for 24 hours: % weight gain | 2.4% | 2.0% | 3.0% | 3.1% |

Composition A exhibits poor flexibility, i.e., adhesion after exposure to elevated temperature conditions, and a 24-hour water boil weight gain of 2.4%. Composition B exhibits excellent flexibility [by wrapping a cured 20 mil (0.020 inch) film around a 0.25 inch radius bend without visual observation of cracking] and the 24-hour water boil weight gain drops to 2.0%.

Compositions C and D also exhibit excellent flexibility, as does Composition B, however these compositions exhibit significantly higher moisture absorptions, under the same conditions.

Example 2

A composition prepared along the lines of composition B was evaluated for stress crack resistance (composition P), and shown to crack after cure and thermal cycling. In an effort to improve stress crack resistance, a transition metal complex was included with the nitrogen containing compound as the curative. Tables 3a and 3b below set forth the components and the general ranges that one might use to prepare desirable compositions within the scope of the present invention.

TABLE 3a

| Resin Component | |
|---|---|
| Component | Weight % |
| Epoxy | 60–95.8 |
| Secondary Amine Adhesion Promoter | 5–30 |
| Curative (nitrogen containing composition and transition metal complex) | 0.2–10 |

TABLE 3b

| Total Underfill Composition | |
|---|---|
| Component | Weight % |
| Resin Component | 25–100 |
| Inorganic Filler | 0–75 |
| Silane Adhesion Promoter | 0.1–1 |
| Flowability Agent | 0–1 |
| Pigment | 0–1.0 |

Compositions E–O were prepared with the components listed in the noted amounts. (See Table 4.)

TABLE 4

| Component | | Composition (Weight %) | | | | | | | | | | |
|---|---|---|---|---|---|---|---|---|---|---|---|---|
| Type | Identity | E | F | G | H | I | J | K | L | M | N | O |
| Epoxy | RE-404-S | 30.9 | 30.9 | 30.9 | 30.9 | 30.9 | 30.9 | 30.9 | 30.9 | 30.9 | 31.5 | 31.4 |
| Secondary Amine | UNILINK 4100 | 4.85 | 4.85 | 4.85 | 5.25 | 5.25 | 5.25 | 5.7 | 5.7 | 5.7 | 4.7 | — |
| Adhesion Promoter | UNILINK 7100 | — | — | — | — | — | — | — | — | — | — | 4.7 |

TABLE 4-continued

| Type | Component Identity | Composition (Weight %) | | | | | | | | | |
|---|---|---|---|---|---|---|---|---|---|---|---|
| | | E | F | G | H | I | J | K | L | M | N | O |
| Curative | CURIMID CN | 1.2 | 1.2 | 1.2 | 1.2 | 1.2 | 1.2 | 1.2 | 1.2 | 1.2 | 1.1 | 1.1 |
| | Co (III) ACAC | 0.08 | 0.08 | 0.08 | 0.08 | 0.08 | 0.08 | 0.08 | 0.08 | 0.08 | — | 0.08 |
| Inorganic Filler | SO-E5 | 62 | 63.5 | 65 | 62 | 63.5 | 65 | 62 | 63.5 | 65 | 62 | 62 |
| Silane Adhesion Promoter | A-187 | — | — | — | — | — | — | — | — | — | 0.3 | — |
| Flowability Agent | A-137 | 0.35 | 0.35 | 0.35 | 0.35 | 0.35 | 0.35 | 0.35 | 0.35 | 0.35 | 0.05 | 0.35 |
| | A-1100 | 0.57 | 0.57 | 0.57 | 0.57 | 0.57 | 0.57 | 0.57 | 0.57 | 0.57 | — | 0.3 |
| Pigment | Carbon Black | 0.12 | 0.12 | 0.12 | 0.12 | 0.12 | 0.12 | 0.12 | 0.12 | 0.12 | 0.12 | 0.12 |

Compositions E–M and O were prepared in accordance with this invention, and demonstrated excellent performance. More specifically, resin castings made from these compositions were cured and cycled for 20 second intervals from temperature extremes of boiling water to liquid nitrogen (a temperature of −181° C.); they performed very well. Composition N, without the transition metal complex, exhibited poor crack resistance. (See below Table 5.)

TABLE 5

| Physical Property | Composition | | | | | | | | | | |
|---|---|---|---|---|---|---|---|---|---|---|---|
| | E | F | G | H | I | J | K | L | M | N | O |
| Ave cycles to initiate cracking | 6.2 | 6.6 | 4.8 | 3.9 | 4.5 | 2.8 | 5.1 | 3.5 | 3.3 | 1.2 | 2.6 |

Example 3

The effect of the transition metal complex, in this case the cobalt complexes Co(II)ACAC and Co(III)ACAC, on the physical properties of cured reaction products was examined-by preparing 1%-cobalt master-batch solutions in the epoxy resin, RE-404-S, and formulating compositions as shown below in Table 6.

TABLE 6

| Component | | Composition (grams) | | | | |
|---|---|---|---|---|---|---|
| Type | Identity | P | Q | R | S | T |
| Epoxy | RE-404-S | 8.8 | 5.8 | 6.8 | 5.8 | 6.8 |
| Secondary Amine Adhesion Promoter | UNILINK 4100 | 1 | 1 | 1 | 1 | 1 |
| Curative (nitrogen containing compositions and transition metal complex) | CURIMID CN | 0.2 | 0.2 | 0.2 | 0.2 | 0.2 |
| | Co(II)ACAC (1%) | — | 3 | 2 | — | — |
| | Co(III)ACAC (1%) | — | — | — | 3 | 2 |

The performance of the compositions was determined on thick neat resin castings with embedded steel washers (to provide extra thermal expansion stress), which were sensitive to cracking during cold exposure. Performance data are set forth below in Table 7.

TABLE 7

| Physical Property: Cracking | Composition | | | | |
|---|---|---|---|---|---|
| | P | Q | R | S | T |
| After cure | Yes | No | No | No | No |
| Dry ice cycles* | — | 6 | 2 | 7 | 4 |

*Number of dry ice exposures until 3 out of 3 specimens exhibited cracking.

Example 4

Compositions U–Z were prepared with the following constituents in the amounts noted below in Table 8.

TABLE 8

| Component | Composition (phr) | | | | |
|---|---|---|---|---|---|
| | U | V | X | Y | Z |
| RE-404-S | 30 | 30 | 30 | 30 | 30 |
| UNILINK 4100 | 5 | 5 | 5 | — | — |
| CURIMID CN | 1.2 | — | 1.2 | 1.2 | 1.2 |
| Co(III)ACAC | 0.1 | 0.1 | — | — | 0.1 |

These compositions were cast and cured by exposure to an elevated temperature of about 150° C. for a period of time of about 2 hours. Performance of the compositions was determined on thick neat resin castings with embedded ⅜" steel washers to provide extra thermal expansion stress.

As shown below in Table 9, the resin castings were cycled between temperature extremes to determine their ability to resist stress cracking. Each cycle consisted of a 20 second immersion into liquid nitrogen followed by immersion into boiling water for 20 seconds.

TABLE 9

| Physical Property | Composition | | | | |
|---|---|---|---|---|---|
| | U | V | X | Y | Z |
| Cycles to initiate cracking | 12 | 0 | 3 | 1 | 1 |

Composition V did not cure completely and cracked while it cooled to room temperature from its cure temperature of 150° C. Compositions Y and Z were observed to be brittle.

Example 5

In this example, Compositions AA–AE were prepared with the following components in the amounts noted in Table 10.

TABLE 10

| Component | | Composition (Weight %) | | | | |
|---|---|---|---|---|---|---|
| Type | Identity | AA | AB | AC | AD | AE |
| Epoxy | RE-404-S | 30.9 | 30.84 | 30.82 | 30.84 | 30.84 |
| Secondary Amine Adhesion Promoter | UNILINK 4100 | 4.85 | 4.85 | 4.85 | 4.85 | 4.85 |
| Curative | Co (III) ACAC | — | — | 0.08 | 0.06 | 0.06 |
| | Co (II) ACAC | — | 0.06 | — | — | — |
| | CURIMID CN | 1.2 | 1.2 | 1.2 | 1.2 | 1.2 |
| Inorganic Filler | SO-E5 | 62 | 62 | 62 | 62 | 62 |
| Flowability Agent | A-137 | 0.05 | 0.05 | 0.05 | 0.05 | 0.35 |
| | KR55 | 0.30 | 0.30 | 0.30 | 0.30 | — |
| | A-1100 | 0.57 | 0.57 | 0.57 | 0.57 | 0.57 |
| Pigment | Carbon Black | 0.13 | 0.13 | 0.13 | 0.13 | 0.13 |

These compositions were cured at a temperature of about 150° C. Die-shear adhesion testing after pressure-cooker preconditioning was then performed on the cured reaction products by allowing the vessel to reach a temperature of about 121° C. under a pressure of about 2 atm, for a period of time of 16 hours. After reaching room temperature, a die shear tester shearingly removed the die from the substrate. This testing provides information as to adhesion retention after exposure to moisture at elevated temperature, data for which is shown in Table 11. The area of adhesion loss (force per area shear strength) is measured in kg ave. A lower value is indicative of lower adhesion and translates into decreased device reliability.

TABLE 11

| | Composition (kg ave) | | | | |
|---|---|---|---|---|---|
| Physical Property | AA | AB | AC | AD | AE |
| 16-hr pressure cooker, die shear | 18.45 | 30.74 | 44.20 | 32.33 | 33.40 |

Accordingly, it is seen that the presence of the secondary amine-based adhesion promoting component, coupled with the combination of the nitrogen containing compound with active hydrogen, such as CURIMID CN, and the transition metal complex, such as Co(III)ACAC, as the curative in the inventive compositions has a dramatic affect in improving the flexibility and adhesion after exposure to elevated temperature conditions, improving the resistance to water absorption, and improving the stress crack resistance of reaction products of the inventive compositions. As such, it is seen that the compositions of the present invention possess utility in commercial applications beyond underfill sealants for microelectronic applications. Indeed, within the realm of microelectronic applications, the inventive compositions may be used as encapsulants, glob top, overfills, and the like. In addition, the inventive compositions may be used in any commercial application where flexible cured epoxy adhesives with low moisture absorption properties and high stress crack resistance are desired.

The present invention has been illustrated above, though its true spirit and scope is defined by the claims.

What is claimed is:

1. A thermosetting resin composition, said composition comprising:

(a) an epoxy resin component;

(b) an adhesion promoter component having at least two Secondary amine functional groups; and (c) a curative based on the combination of a nitrogen-containing compound and a transition metal complex.

2. The composition of claim 1, capable of sealing underfilling between a semiconductor device and a circuit board to which said semiconductor device is electrically connected, or a semiconductor chip and a circuit board to which said semiconductor chip is electrically connected.

3. The composition according to claim 1, wherein the epoxy resin component includes members selected from the group consisting of $C_6$–$C_{28}$ alkyl glycidyl ethers; polyglycidyl ethers of pyrocatechol, resorcinol, hydroquinone, 4,4'-dihydroxydiphenyl methane, 4,4'-dihydroxy-3,3'-dimethyldiphenyl methane, 4,4'-dihydroxydiphenyl dimethyl methane, 4,4'-dihydroxydiphenyl methyl methane, 4,4'-dihydroxydiphenyl cyclohexane, 4,4'-dihydroxy-3,3'-dimethyldiphenyl propane, 4,4'-dihydroxydiphenyl sulfone, and tris(4-hydroxyphyenyl)methane; polyglycidyl ethers of the chlorination and bromination products of the above-mentioned diphenols; polyglycidyl ethers of novolacs; polyglycidyl ethers of diphenols obtained by esterifying ethers of diphenols obtained by esterifying salts of an aromatic hydrocarboxylic acid with a dihaloalkane or dihalogen dialkyl ether; polyglycidyl ethers of polyphenols obtained by condensing phenols and long-chain halogen paraffins containing at least two halogen atoms; N,N'-diglycidyl-aniline; N,N'-dimethyl-N,N'-diglycidyl-4,4'-diaminodiphenyl methane; N,N,N',N'-tetraglycidyl-4,4'-diaminodiphenyl methane; N-diglycidyl-4-aminophenyl glycidyl ether; N,N,N',N'-tetraglycidyl-1,3-propylene bis-4-aminobenzoate; bisphenol A epoxy resin, bisphenol F epoxy resin, phenol novolac epoxy resin, cresol novolac epoxy resin and combinations thereof.

4. The composition according to claim 1, wherein the adhesion promoter including at least two secondary amine functional groups is within the following structure I:

I wherein R and $R^1$ may be the same or different and may be selected from $C_{1-12}$ alkyl, $C_{1-12}$ alkenyl, $C_{5-12}$ cyclo or bicycloalkyl, $C_{6-18}$ aryl, and derivatives thereof, and ○ may be selected from $C_{1-12}$ alkylene, $C_{1-12}$ alkenylene, $C_{5-12}$ cyclo or bicycloalkylene, $C_{5-12}$ cyclo or bicyclalkenylene, $C_{6-18}$ arylene and derivatives thereof.

5. The composition according to claim 1, wherein the adhesion promoter component including at least two secondary amine functional groups is a member selected from the group consisting of 6. The composition according to claim 1, wherein the adhesion promoter component including at least two secondary amine functional groups is present in an amount within the range of from 5 to about 30 weight percent, based on the total composition.

7. The composition according to claim 1, wherein the nitrogen containing compound is a member selected from the group consisting of amines, imidazoles, amides, and composition thereof.

8. The composition according to claim 7, wherein the amines are selected from the group consisting of 1,5-diazabicyclo[3.4.0]non-5-ene, 1,8-diazabicyclo[5.4.0]undec-7-ene, 1,5,7-triazabicyclo[4.4.0]dec-5-ene, quinuclidine, 1,4-diazabicyclo[2.2.2]octane, diethylenetriamine, triethylenetetraamine, diethylaminopropylamine, benzyl dimethylamine, m-xylenediamine, diaminodiphenylamine, quinoxaline, isophoronediamine and menthenediamine.

9. The composition according to claim 7, wherein the imidazoles are selected from the group consisting of imidazole, isoimidazole, 2-methyl imidazole, 2-ethyl-4-methylimidazole, 2,4-dimethylimidazole, butylimidazole, 2-heptadecenyl-4-methylimidazole, 2-undecenylimidazole, 1-vinyl-2-methylimidazole, 2-undecylimidazole, 2-heptadecylimidazole, 2-phenylimidazole, 1-benzyl-2-methylimidazole, 1-propyl-2-methylimidazole, 1-cyanoethyl-2-methylimidazole, 1-cyanoethyl-2-ethyl-4-methylimidazole, 1-cyanoethyl-2-undecylimidazole, 1-cyanoethyl-2-phenylimidazole, 1-guanaminoethyl-2-methylimidazole and addition products of an imidazole methylimidazole and addition products of an imidazole and trimellitic acid, 2-n-heptadecyl-4-methylimidazole, phenylimidazol, benzylimidazole, 2-methyl-4,5-diphenylimidazole, 2,3,5-triphenylimidazole, 2-styrylimidazole, 1-(dodecyl benzyl)-2-methylimidazole, 2-(2-hydroxyl-4-t-butylphenyl)-4,5-diphenylimidazole, 2-(2-methoxyphenyl)-4,5-diphenylimidazole, 2-(3-hydroxyphenyl)-4,5-diphenylimidazole, 2-(p-dimethyl-aminophenyl)-4,5-diphenylimidazole, 2-(2-hydroxyphenyl)-4,5-diphenylimidazole, di(4,5-diphenyl-2-imidazole)-benzene-1,4, 2-napthyl-4,5-diphenylimidazole, 1-benzyl-2-methylimidazole, 2-p-methoxystyrylimidazole, and combinations thereof.

10. The composition according to claim 7, wherein the imidazole is 1-(2-cyanoethyl)-2-ethyl-4-methylimidazole.

11. The composition according to claim 1, wherein the transition metal complex is a member selected from the group consisting of wherein $R_1$ and $R_2$ are the same or different and occur at least once and up to as many four times on each ring in the event of a five-membered ring and up to as many as five times on each ring in the event of a six-membered ring;

$R_1$ and $R_2$ are selected from the group consisting of H; any straight- or branched-chain alkyl constituent having from 1 to about 8 carbon atoms, acetyl; vinyl; allyl; hydroxyl; carboxyl; —(CH$_2$)$_n$—OH, wherein n is an integer in the range of 1 to about 8; —(CH$_2$)$_n$—COOR$_3$, wherein n is an integer in the 2' range of 1 to about 8 and $R_3$ is any straight- or branched-chain alkyl constituent having from 1 to about 8 carbon atoms; H; Li; Na; —(CH$_2$)$_n$—OR$_4$, wherein n is an integer in the range of 1 to about 8 and $R_4$ is any straight- or branched-chain alkyl constituent having from 1 to about 8 carbon atoms; or —(CH$_2$)$_n$N$^+$(CH$_3$)$_3$ X$^-$, where n is an integer in the range of 1 to about 8 and X is Cl$^-$, Br$^-$, I$^-$, ClO$_4^-$ or BF$_4^-$;

$Y_1$ and $Y_2$ may not be present at all, but when at least one is present they are the same or different and are selected from the group consisting of H, Cl$^-$, Br$^-$, I$^-$, cyano, methoxy, acetyl, hydroxy, nitro, trialkylamines, triaryamines, trialkylphospines, triphenylamine and tosyl;

A and A' are the same or different and are C or N;

m and m' are the same or different and are 1 or 2; and

$M_e$ is Fe, Ti, Ru, Co, Ni, Cr, Cu, Mn, Pd, Ag, Rh, Pt, Zr, Hf, Nb, V, and Mo;

VIII wherein $R_1$, $R_2$, $Y_1$, $Y_2$, A, A', m, m' and $M_e$ are as defined above;

IX wherein $R_1^-$, $R_2$ and $M_e$ are as defined above; and $M_e[CW_3-CO-CH=C(O^-)-CW'_3]_2$, wherein $M_e$ is as defined above, and W and W' are the same or different and are selected from H, and halogens.

12. The composition according to claim 1, wherein the transition metal complex is a member selected from the group consisting of platinum (II) acetylacetonate; cobalt (II) acetylacetonate; cobalt (III) acetylacetonate; nickel (II) acetylacetonate; copper (II) acetylacetonate; iron (II) acetylacetonate; iron (III) acetylacetonate: chromium (II) acetylacetonate; chromium (III) acetylacetonate; manganese (II) acetylacetonate; manganese (III) acetylacetonate; copper (II) acetylacetonate; and combinations thereof.

13. The composition according to claim 1, wherein the transition metal complex is a member selected from the group consisting of cobalt (II) acetylacetonate; cobalt (III) acetylacetonate; and combinations thereof.

14. The composition according to claim 1, wherein the curative is present in an amount within the range of 0.5 to about 10 weight percent.

15. Reaction products according to claim 1.

\* \* \* \* \*